United States Patent
Grossman et al.

(10) Patent No.: US 8,537,618 B2
(45) Date of Patent: Sep. 17, 2013

(54) RAM MEMORY DEVICE WITH NAND TYPE INTERFACE

(76) Inventors: Steven Jeffrey Grossman, Sarasota, FL (US); Ward Parkinson, Boise, ID (US); Daniel Robert Shepard, North Hampton, NH (US); Thomas Michael Trent, Nashua, NH (US); Sam Ira Young, San Jose, CA (US)

( * ) Notice: Subject to any disclaimer, the term of this patent is extended or adjusted under 35 U.S.C. 154(b) by 111 days.

(21) Appl. No.: 13/199,328

(22) Filed: Aug. 26, 2011

(65) Prior Publication Data

US 2012/0051140 A1     Mar. 1, 2012

Related U.S. Application Data

(60) Provisional application No. 61/402,238, filed on Aug. 26, 2010.

(51) Int. Cl.
*G11C 11/34* (2006.01)

(52) U.S. Cl.
USPC .............................. 365/185.18; 365/185.24

(58) Field of Classification Search
USPC ....................................... 365/185.18, 185.24
See application file for complete search history.

(56) References Cited

U.S. PATENT DOCUMENTS

| | | | |
|---|---|---|---|
| 6,657,472 B1 * | 12/2003 | Raza et al. | 327/217 |
| 6,753,561 B1 | 6/2004 | Rinerson et al. | |
| 6,977,842 B2 | 12/2005 | Nazarian | |
| 7,149,934 B2 | 12/2006 | Shepard | |
| 7,362,609 B2 | 4/2008 | Harrison et al. | |
| 7,568,135 B2 * | 7/2009 | Cornwell et al. | 714/721 |
| 7,813,157 B2 | 10/2010 | Shepard | |
| 8,035,416 B1 | 10/2011 | Shepard | |
| 8,351,238 B2 | 1/2013 | Shepard | |
| 2007/0295949 A1 | 12/2007 | Lee | |
| 2009/0024819 A1 | 1/2009 | Fisher et al. | |
| 2009/0055569 A1 | 2/2009 | Maheshwari et al. | |
| 2009/0063757 A1 | 3/2009 | Norman | |
| 2010/0232200 A1 | 9/2010 | Shepard | |
| 2010/0333166 A1 | 12/2010 | Herrod | |
| 2011/0035542 A1 | 2/2011 | Norman | |
| 2011/0128766 A1 | 6/2011 | Parkinson | |
| 2012/0155174 A1 * | 6/2012 | Cornwell et al. | 365/185.09 |
| 2012/0159051 A1 * | 6/2012 | Hida et al. | 711/103 |
| 2012/0159284 A1 * | 6/2012 | Ohta | 714/763 |
| 2012/0206977 A1 * | 8/2012 | Shibata et al. | 365/185.22 |

* cited by examiner

*Primary Examiner* — Michael Tran

(57) ABSTRACT

A random access memory device is disclosed having an interface that is compatible with a NAND FLASH memory device such that the device can be operated with a standard NAND memory device's controller device. This memory device is can store data internally using any random access storage technology including PRAM, MRAM, RRAM, FRAM, OTP-RAM and 3-D memory.

11 Claims, 5 Drawing Sheets

RAM MEMORY DEVICE WITH NAND TYPE INTERFACE

CROSS-REFERENCE TO RELATED APPLICATION

This application claims priority to U.S. Provisional Patent Application No. 61/402,238 that was filed on Aug. 26, 2010 and that application is incorporated herein in its entirety by reference. This application makes reference to and incorporates herein by reference in their entirety, U.S. Pat. No. 7,813,157 by Shepard titled "NON-LINEAR CONDUCTOR MEMORY" which issued on Oct. 12, 2010, and U.S. Pat. No. 7,149,934 by Shepard titled "ERROR CORRECTING MEMORY ACCESS MEANS AND METHOD" which issued on Dec. 12, 2006, and allowed U.S. patent application Ser. No. 12/827,545 by Shepard titled "BIPOLAR-MOS DRIVER CIRCUIT" that was filed on Jun. 30, 2010, and U.S. patent application Ser. No. 12/417,245 by Shepard titled "LOW COMPONENT COMPLEXITY ELECTRONIC CIRCUITS AND METHODS FOR FORMING THE SAME" that was filed on Apr. 2, 2009, and U.S. patent application Ser. No. 12/720,843 by Shepard titled "$4F^2$ MEMORY CELLS COMPRISING THREE OR FOUR TERMINAL ACTIVE DEVICES" that was filed on Mar. 10, 2010.

TECHNICAL FIELD

In various embodiments, the present invention relates to memory devices, and more particularly to memory devices having command based control logic.

BACKGROUND

As advances continue to be made in the area of semiconductor memory devices, high capacity and low cost will be increasingly important. In particular, memory cell designs having a footprint no larger than $4F^2$ are increasingly desired to provide high density. FLASH memory has been a preferred technology for many years, but as devices continue to be scaled smaller, limits to FLASH memory devices are beginning to be reached. New technologies are being developed such as Magnetic RAM (MRAM), Resistive Change RAM (RRAM) and Phase Change RAM (PRAM). Unfortunately for these technologies, they will have to overcome an entrenched base of FLASH memory design wins in order to be adopted and succeed.

For high density storage applications, NAND FLASH has been the technology of choice because of its efficient memory cell (approximately $4F^2$). One tradeoff to achieving this efficient cell design is that many cells must be accessed in parallel for reading and writing. A typical NAND FLASH array segment is depicted in FIG. 1 showing an array of bit line chains. NAND FLASH uses a chain (i.e., that are connected in series) of floating-gate transistors. A single bit line chain is shown in FIG. 2. When all of the word lines are pulled high (above the $V_T$ of all of the transistors in the chain) a path through all of the transistors is completed and the bit line is pulled low. If a particular memory cell is programmed such that a charge is present on its floating gate, that cell will be "switched on" even without asserting the word-line connected to that gate (or by only raising that word-line to the $V_T$ of an erased bit). To read the array, a voltage is placed on all the word-lines other than to the cell to be accessed such that every transistor in the chain is switched on sufficiently to otherwise pass a current (i.e., word-lines are pulled up above the $V_T$ of a programmed bit regardless of the charge on their respective gates) and connect the bit-line through the chain to ground. If the particular memory cell to be accessed has a charge trapped on its gate, that transistor will also be switched on and the bit-line will be pulled low (to ground); otherwise, if the particular memory cell to be accessed has no charge trapped on its gate, that memory cell will be in the off state whereby it will interrupt the current path and the bit-line will remain high.

When bit-lines are being accessed as a part of an array (FIG. 1), because the word-lines are common to many chains, all the corresponding bit-lines are accessed at once and the many bits of data are accessed together. For writing the array, the given word-line is asserted with a higher programming voltage and each bit-line is either left floating or connected to a voltage (e.g., ground) depending upon the bit to be programmed. Because reading and writing are both operations that are performed on many bits simultaneously, large bit buffer registers are required to hold those bits to be programmed or to hold the read bits until they can be accessed in smaller groups (e.g., bytewise). To perform these and other operations on NAND FLASH (e.g., memory wearout management), a command based operation has been developed for these chips.

Many new technologies have been developed based on cross-point array designs (such as a diode matrix array) where a row and a column are selected and a resulting current passes through the targeted memory cell to write or read a data bit. Accessing these designs can be performed on a bitwise basis and these designs are truly random access parts. As a consequence, no large bit buffer registers are required. Other logic to support buffer-based operation and other functions to support NAND FLASH operation (such as "Read ID", for example, are specified in the ONFI standard and implemented with additional logic is clear to those skilled in the art of NAND FLASH design) that are present in FLASH memory are not required in these new technologies. In so much as the bit buffer registers and other logic to support other FLASH functions can occupy a significant die area, cross-point array designs can be much more efficient than their NAND FLASH Memory predecessors.

What is needed is a random access, cross-point array memory device based on new PRAM, MRAM or RRAM technology that can be scaled beyond the scaling limits of FLASH, and for which there are existing designs for a potential quick design win. Furthermore, this needed memory device should be low cost to manufacture and should utilize existing manufacturing tools and techniques.

SUMMARY

The present invention is a means and a method for maximizing potential design wins for PRAM and other new technology based memory devices. In particular, the present invention to a great extent is a means and method for making a Random Access Memory (RAM) component fit into the socket of a NAND FLASH component by utilizing the interface, timing and commands and operation sequence of a standard NAND FLASH memory component. This implementation can in all aspects replicate the functionality of NAND FLASH for an absolute replacement part except for the storage mechanism being phase-change, resistive or magnetic technology instead of the trapped electron charge technology of NAND. This implementation can include the large buffering storage registers for moving data between the external interface and the internal storage just like NAND, however, in a desirable variation, the fact that a RAM does not require the internal architecture nor the parallelized reading and writing of NAND FLASH enables the space saving implementation of enabling the external interface to move data directly between the internal storage and the outside system.

For NAND FLASH compatible chips (as is also true of rotating (disc) media), a controller is often used to provide memory management and interface, as well as to provide extensive ECC within a selected page (or sector) through use of extra bits (such as 16 extra (ECC) bytes per 512 (Data) bytes). Both the interface, management, and ECC are highly desirable and have evolved to be competitive advantages in the marketplace—such as relative to NOR FLASH for many applications, especially those that are stored data intensive.

As the techniques implemented in the controller evolved over time (as NAND FLASH grew in number of bits/chip and/or MLC), the failure rates have increased on the memory chip. However, the ECC and memory management techniques have improved to accommodate ever more errors and types within the memory chip. For example, as many as 5 random bad bits per 5000 bits in the memory sector (512+16 bytes) are allowed and are correctable by the controller. Similarly, whole 128K byte blocks may be bad and deleted from access by the customer (by writing "delete" or "do not use" codes into the memory and/or a table on the controller chip.

These companion controller chips are therefore increasingly complex and sophisticated. However this has also required ever more design, debug, test vector complexity, and yield enhancement in the development of the controller chip is required on the chips. Today's production chip may have been months or even years in development.

The controller chips tend be "standard" by manufacturer and function, and may use various manufacturer's memory chips in the addressed storage space. In turn, the memory chips may function with the controller of more than one manufacturer. By a customer's ability to choose from more than one manufacturer for a controller and more than one manufacturer of memory chips, and yet achieve comparable results, the customer is able improve the quality and lower the cost of the resulting system, plus improve the ability to acquire an adequate supply of controller and memory chips. If a controller chip must be customized for use with a new technology, the flexibility on controller and its availability from multiple sources may be lost. And the lead time and cost to evolve the customization of a new or modified controller chip may introduce substantial delays and cost to market, with attendant risks to functionality and adequate testing relative to a higher volume standard controller.

Embodiments of the present invention may comprise the standard physical interface (pullout) of a NAND FLASH in a TSOP-48, WSOP-48, LGA-52, or BGA-63 package, as well as the standard command set (or subset thereof) for reading, writing, and erasing the memory cells including a mechanism for self-identification (similar to the Serial Presence Detection function of certain SDRAM memory modules).

The memory array built comprising the present invention may be programmed with data including or consisting essentially of music, video, computer software, a computer application, reference data, text, and/or a diagram. The memory array may be disposed within a removable memory storage device. The memory array may include or consist essentially of a plurality of storage cells. At least one of the storage cells may include or consist essentially of a phase-change material. The data will typically include error correcting bits, but might not in some cases.

Embodiments of the invention may be implemented with silicon based materials, however, other semiconducting materials are contemplated as well including III-V semiconductors and organic semiconductors and MEMS-like components and arrays. Embodiments of the invention may be implemented in conjunction with various information storage materials and techniques including resistive change materials, phase-change materials (e.g., a chalcogenide material), magnetic materials (for MRAM), a ferroelectric material, a magnetoresistive material, a magnetic tunnel junction, a spin-transfer torque element, One Time Programmable (OTP) materials such as a fuse or anti-fuse material, charged oxide materials, an insulating metal oxide, a conductive metal oxide, a dual layer oxide, trapped charge devices, and many more.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawing, in which.

DETAILED DESCRIPTION

Figure 1:
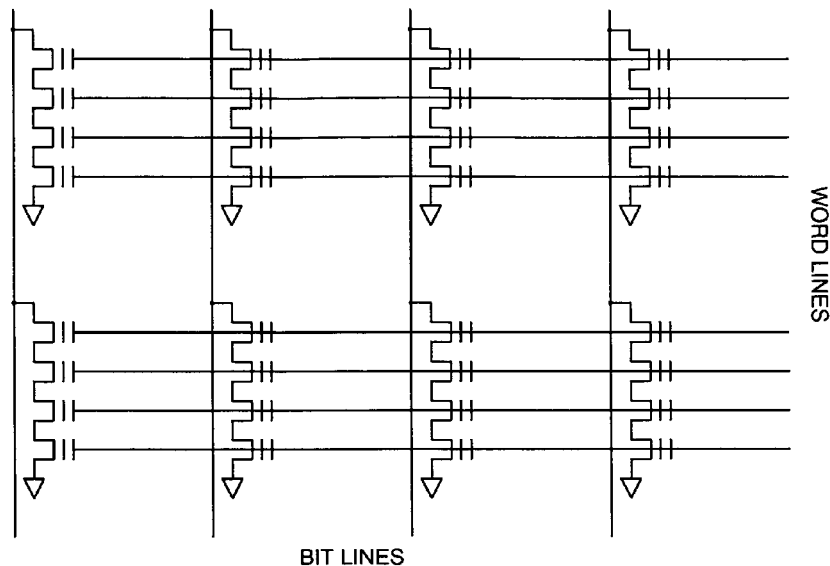
FIG. 1 is a partial schematic diagram of a NAND FLASH memory array in accordance with the prior art.
Figure 2:
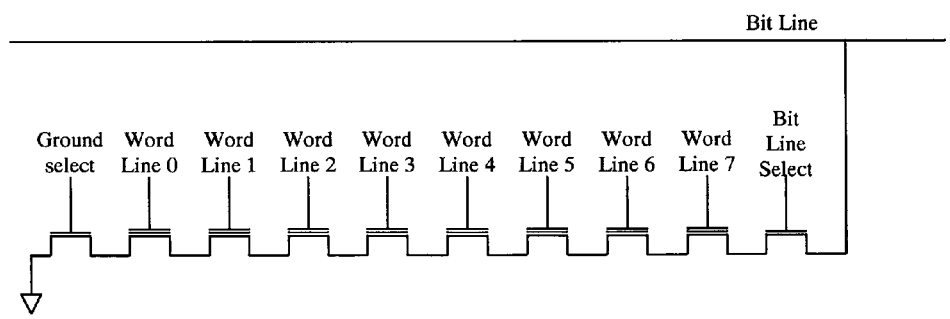
FIG. 2 is a partial schematic diagram depicting a chain of NAND FLASH memory cells in accordance with the prior art.
Figure 3:
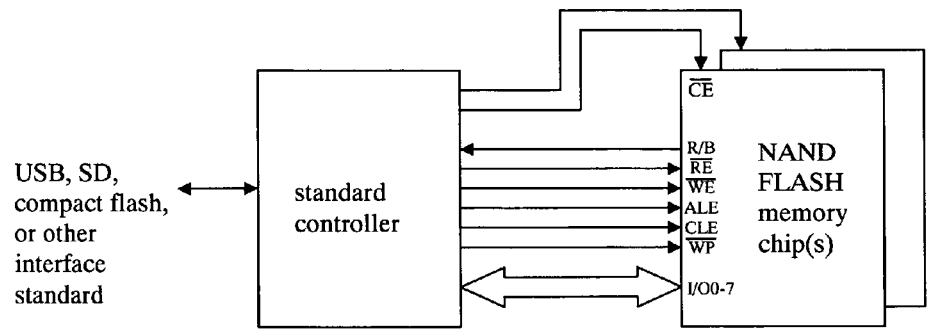
FIG. 3 is a block diagram of a standard NAND FLASH memory chip paired with a standard controller chip.
Figure 4:
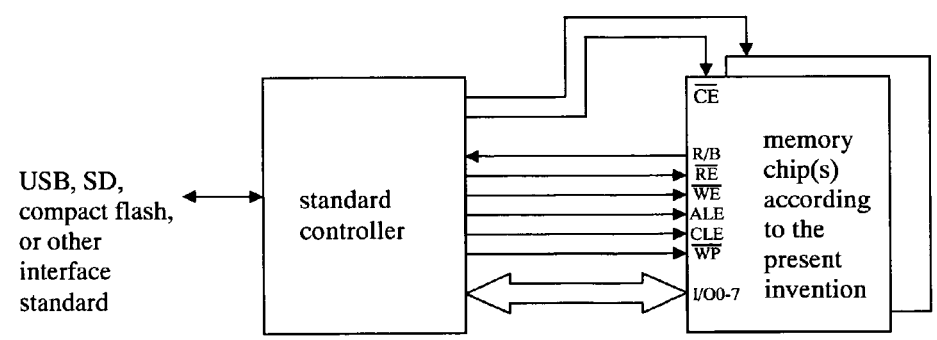
FIG. 4 is a block diagram of a standard controller chip paired with a memory device in accordance with an embodiment of the invention.

The present invention is for a phase-change, resistive change, or MRAM memory device to be functionally identical to a standard NAND FLASH memory device such that it can be a pin for pin drop in replacement for a NAND FLASH device that can operate with an standard, existing NAND FLASH memory controller. FIG. 3 depicts a block diagram for a standard NAND FLASH memory chip paired with a standard controller chip. Not only can a chip according to the present invention be implemented as an exact replacement component for NAND FLASH except for the internal bit storage technology, it could also be designed as a super-set of NAND FLASH by implementing new commands not present in a standard NAND FLASH part (via unused command codes) thereby enabling such to be paired with standard controllers (albeit without accessing the added, super-set commands) as well as with slightly modified NAND controllers (typically with such modifications made only in the controller's firmware so that the controller modification cost is kept low). A further level of deviation from the NAND FLASH standard design could allow other advantageous enhancements (such as an inverted signal input to the –CE pin) that could also be accommodated by only a firmware change in some controllers. FIG. 4 depicts a block diagram for a standard controller chip having only firmware modifications in a paring with a memory chip according to the present invention. Note that in both FIGS. 3 and 4 that more than one memory chip can be interfaced to a given controller at a time through the use of separate chip select (CE) pins; further note that the CE pins of the controller have been inverted (through firmware) to accommodate an inverted CE input on the memory device.

Figure 5:
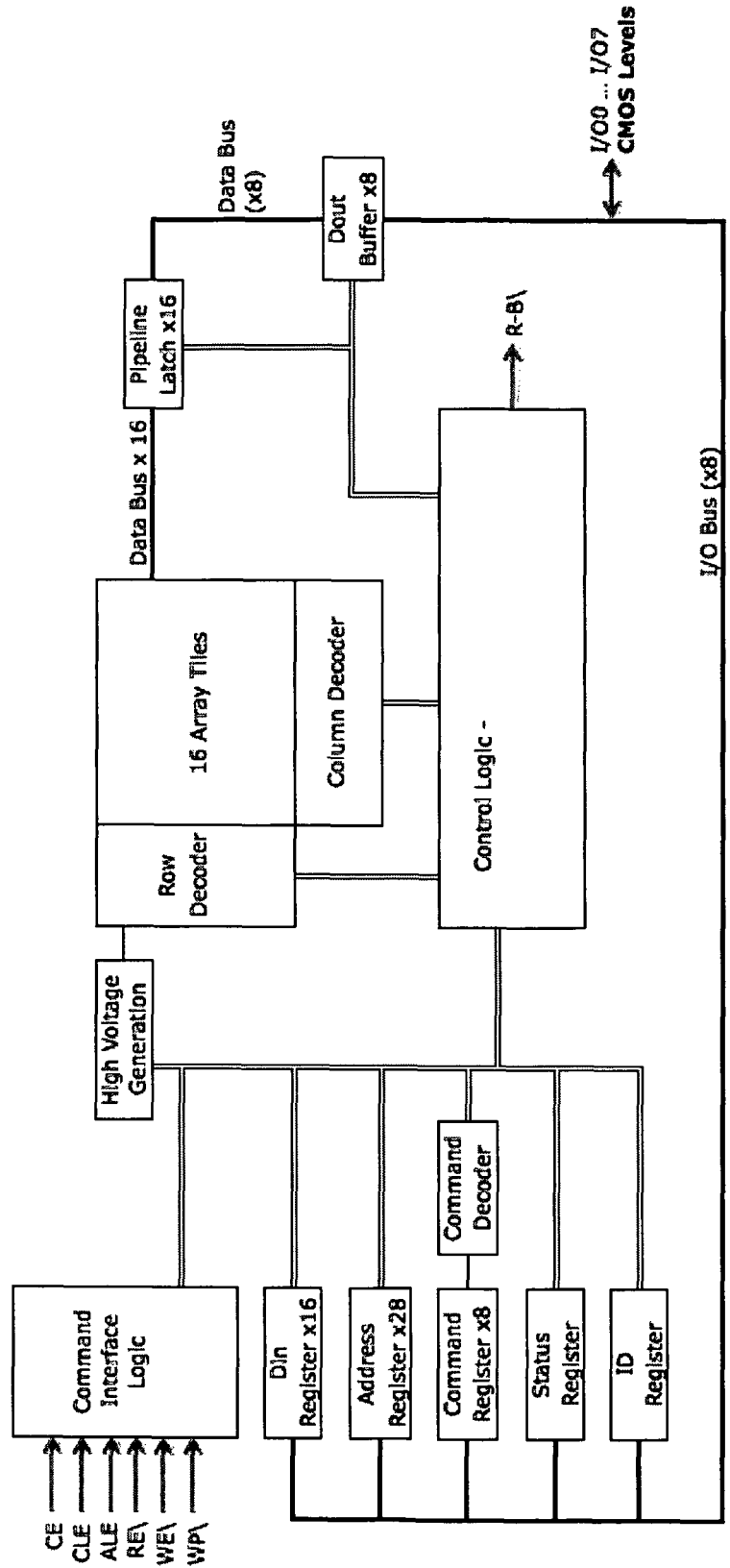
FIG. 5 is a block diagram of a memory device in accordance with an embodiment of the invention.

FIG. 5 depicts a block diagram of a memory device according to an embodiment of the present invention. In this device, logic in the periphery is shown for implementing a command set to interface to external circuitry and this is well understood by those skilled in the art. This command set is a subset of the commands to implement a NAND FLASH memory device. The commands not implemented correspond to actions that involve operations on circuits not included in the implementation, such as buffer related operations; in the present invention, because the memory cells are not wired in series, the various memory cells can be accessed individually. As such, the buffering of many memory bits for the purpose of highly parallelized read and write actions is unnecessary.

With a NAND FLASH memory device, the memory cells are grouped into serial chains of memory cells and these cells are read and written in parallel. In order to move data into and out of the device (without the necessity of having large numbers of data bus lines and the corresponding costs of high pin counts), the data is moved into and out of the device in smaller sizes (e.g., as bytes or words) and are collected in an intermediate buffer that is used to move the much larger page of collected data into and out of the NAND memory cells in parallel. While it is a provision of the present invention to fully implement a read/write buffer thereby enabling all NAND FLASH commands (including commands that relate to buffer operations such as copy buffer to memory, load buffer from memory, and commands that operate on the data in the buffer), the present invention also contemplates implementations that exclude the buffers to reduce die size and chip cost and increase performance.

Since internally, the data need not be moved into or out of the memory array in bulk via a data buffer, the data must be moved into and out of the internal bit storage array concurrent with data movement into and out of the memory chip. In such case, commands to transfer pages of data between a NAND chip's data buffer and the internal bit storage array can be ignored, but could be used to set an internal flag to indicate the type of operation to follow.

Figure 6:
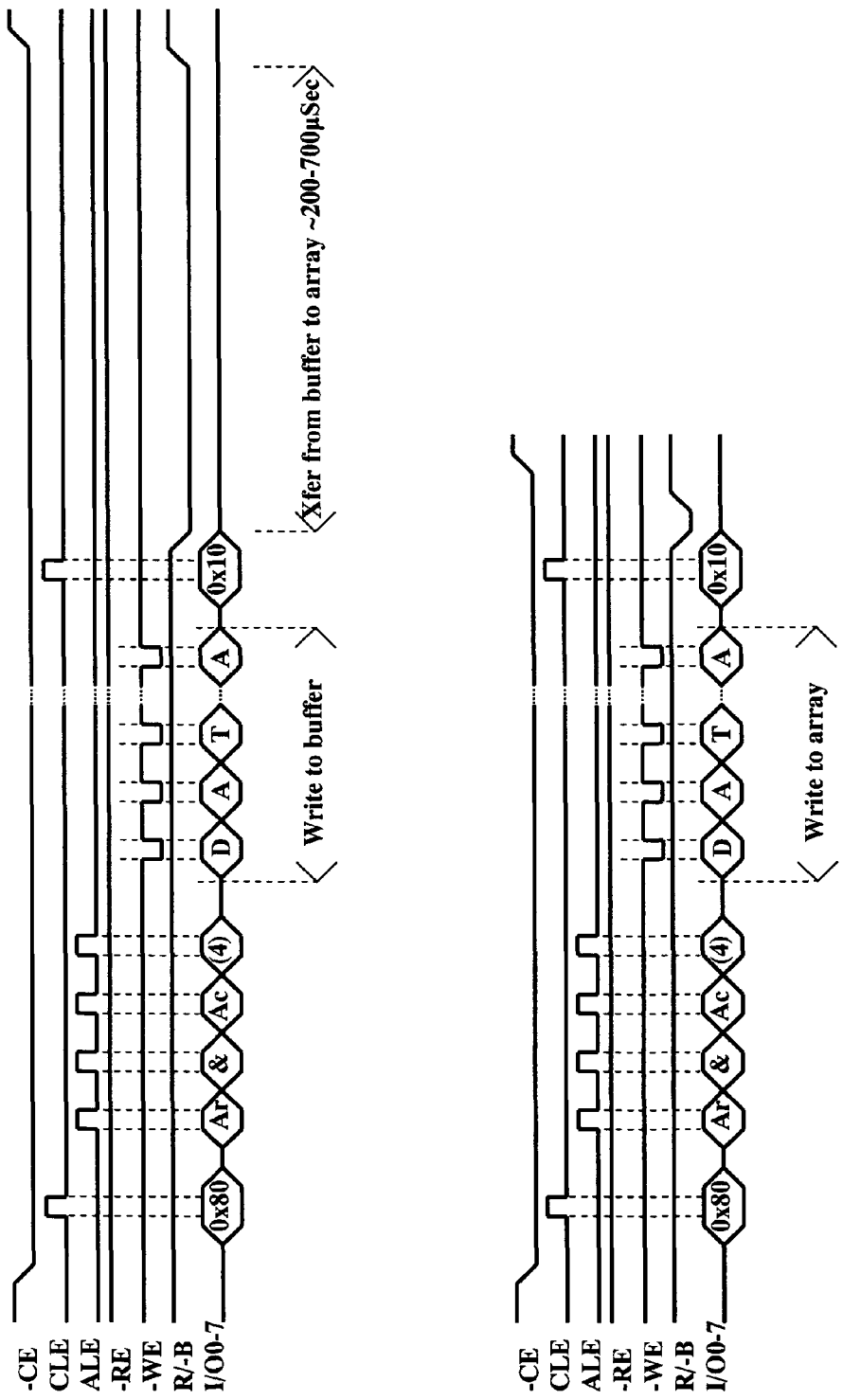
FIG. 6 is a timing diagram of the READ waveforms of a standard NAND memory along with a memory device in accordance with an embodiment of the invention.

FIG. 6 depicts a generalized timing diagram of a "Page Program" command for both a NAND device and a device according to the present invention. In a NAND program operation, a stream of bytes is sent to the chip consisting of a command (i.e., a "Page Program" command) followed by addressing information and the data; this page of data is written into the NAND data buffer and then, only once the entire page of data has been received, the contents of the data buffer is programmed in parallel into the array. As depicted in the top timing diagram of FIG. 6, the controller would assert the chip enable low (−CE) and then would present the "Page Program" command byte (0x80); the Command Latch Enable (CLE) signal would be pulsed to indicate the command byte is available on the Input/Output Bus (I/O0-7). This is followed by placing the address bytes on the I/O Bus and pulsing the Address Latch Enable signal (ALE) to indicate the availability of each address byte. The data bytes are then written to the internal buffer and as each byte of data is made available on the I/O bus, the Write Enable signal (−WE) is pulsed. At the completion of the data byte transfer, the "Program Confirm" command byte (0x10) is written to the device; the Command Latch Enable (CLE) signal would again be pulsed to indicate the command byte is available on the I/O Bus. When the NAND device receives the "Program Confirm" command byte, the Ready/−Busy signal (R/−B) is put into the Busy state while internal logic copies the data from the internal buffer into the memory array. When the data has been copied, Ready/−Busy is returned to the Ready state and the controller then knows the operation is complete and the NAND device is released by un-asserting the Chip Enable signal.

With the present invention, the "Page Program" command could transfer a page of data from an internal data buffer into the array or, in the preferred embodiment of the present invention when no internal buffer is implemented, the "Page Program" command would indicate to the support logic that a program operation is about to be effected and as the page of data is provided to the chip, it is written directly into the memory array (i.e., each byte of the page is written to the array as a random access write while the address is advanced sequentially with each byte). As depicted in the lower timing diagram of FIG. 6, the controller would assert the chip enable low (−CE) and then would present the "Page Program" command byte (0x80); the Command Latch Enable (CLE) signal would be pulsed to indicate the command byte is available on the Input/Output Bus (I/O0-7). This is followed by placing the address bytes on the I/O Bus and pulsing the Address Latch Enable signal (ALE) to indicate the availability of each address byte. The data bytes are then written to the device and as each byte of data is made available on the I/O bus, the Write Enable signal (−WE) is pulsed and the data byte is copied directly into the memory array. At the completion of the data byte transfer, the "Program Confirm" command byte (0x10) is written to the device; the Command Latch Enable (CLE) signal would again be pulsed to indicate the command byte is available on the I/O Bus. When a device according the the present invention receives the "Program Confirm" command byte, the Ready/−Busy signal (R/−B) is briefly put into the Busy state so that logic in the controller that expects to see a transition on Ready/−Busy will be triggered, at which point the controller then knows the operation is complete and the NAND device is released by un-asserting the Chip Enable signal.

Figure 7:
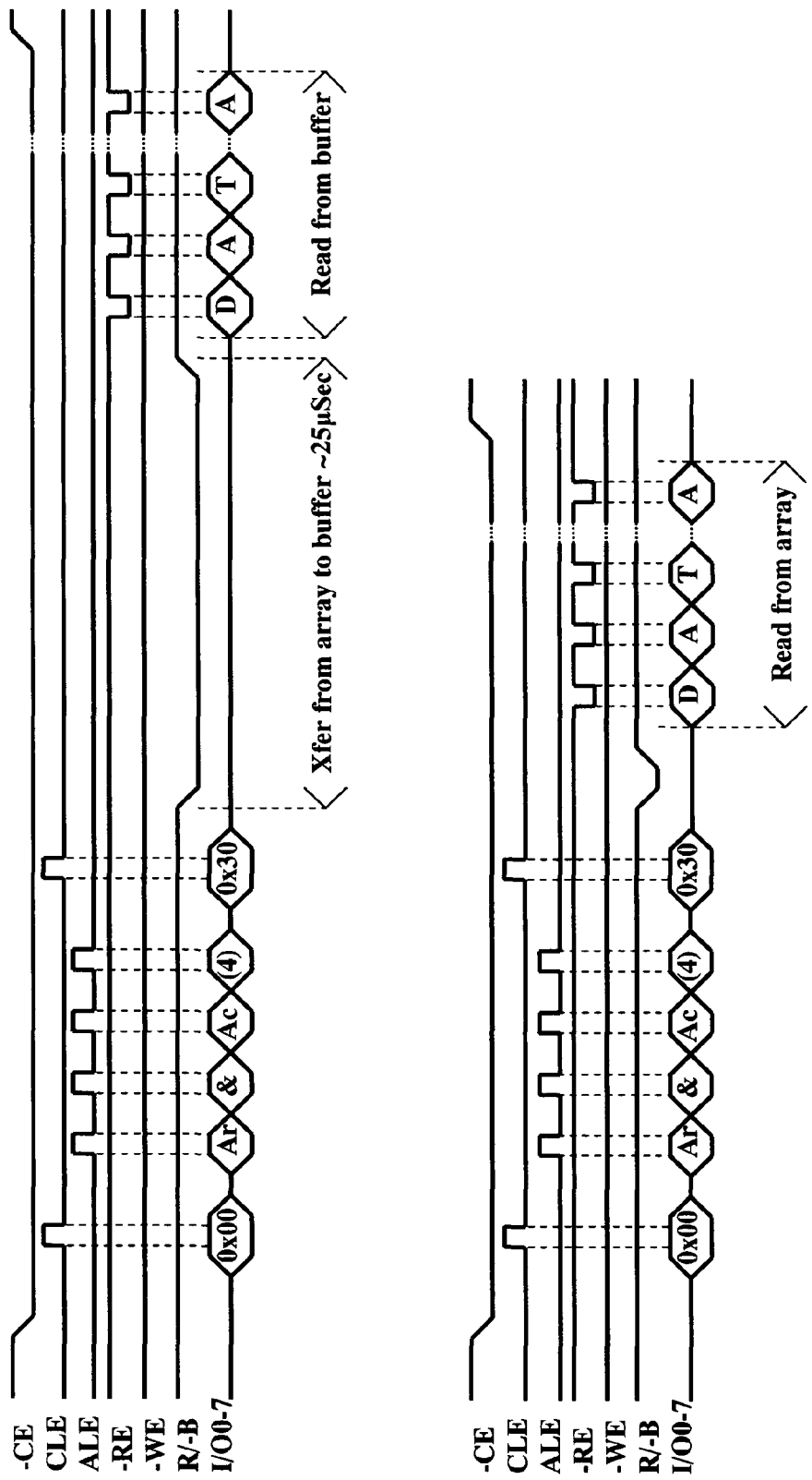
FIG. 7 is a timing diagram of the PROGRAM waveforms of a standard NAND memory along with a memory device in accordance with an embodiment of the invention.

FIG. 7 depicts a generalized timing diagram of a "Page Read" command for both a NAND device and a device according to the present invention. With a standard NAND part, the read operation command would indicate a read operation is being effected along with addressing information that would cause the data to be copied from the array into the buffer and, once in the buffer, could be read out of the NAND chip. In the present invention when no internal buffer is implemented, the read command and addressing information is provided and the data is retrieved from the chip directly from the array. A ready/busy output signal pin is provided on a NAND chip to indicate when an operation, such as a data transfer between the array and the buffer, is completed (as these operations can have a time delay associated with them) such that transfer of data from the chip can commence.

As depicted in the top timing diagram of FIG. 7, the controller would assert the chip enable low (−CE) and then would present the "Page Read" command byte (0x00); the Command Latch Enable (CLE) signal would be pulsed to indicate the command byte is available on the Input/Output Bus (I/O0-7). This is followed by placing the address bytes on the I/O Bus and pulsing the Address Latch Enable signal (ALE) to indicate the availability of each address byte. At the completion of the address transfer, the "Read Confirm" command byte (0x30) is written to the device; the Command Latch Enable (CLE) signal would again be pulsed to indicate the command byte is available on the I/O Bus. When the NAND device receives the "Read Confirm" command byte, the Ready/–Busy signal (R/–B) is put into the Busy state while internal logic copies the data from the memory array into the internal buffer. When the data has been copied, Ready/–Busy is returned to the Ready state and the controller then knows the data transfer to the internal buffer is complete and the data is available to be retrieved. The data bytes are then sequentially read from the internal buffer by toggling the Write Enable signal (–WE). The controller must keep track of the number of bytes to be retrieved and once the data has been retrieved the NAND device is released by un-asserting the Chip Enable signal.

With the present invention, the "Page Read" command could transfer a page of data from the array through an internal data buffer or, in the preferred embodiment of the present invention when no internal buffer is implemented, the "Page Read" command would indicate to the support logic that a read operation is about to be effected. Once the address is provided to the chip and the "Read Confirm" command has been received, data is read directly from the memory array (i.e., each byte of the page is read from the array as a random access read while the address is advanced sequentially with each byte).

As depicted in the lower timing diagram of FIG. 7, the controller would assert the chip enable low (–CE) and then would present the "Page Read" command byte (0x00); the Command Latch Enable (CLE) signal would be pulsed to indicate the command byte is available on the Input/Output Bus (I/O0-7). This is followed by placing the address bytes on the I/O Bus and pulsing the Address Latch Enable signal (ALE) to indicate the availability of each address byte. At the completion of the address transfer, the "Read Confirm" command byte (0x30) is written to the device; the Command Latch Enable (CLE) signal would again be pulsed to indicate the command byte is available on the I/O Bus. When a device according to the present invention receives the "Read Confirm" command byte, the Ready/–Busy signal (R/–B) is briefly put into the Busy state so that logic in the controller that expects to see a transition on Ready/–Busy will be triggered, at which point the controller then knows the data is available to be retrieved. The data bytes are then sequentially read directly from the memory array by toggling the Write Enable signal (–WE). The controller must keep track of the number of bytes to be retrieved and once the data has been retrieved the device is released by un-asserting the Chip Enable signal.

As can be seen from these two examples, a device according to the present invention and a standard NAND FLASH device can be compatible with the same controller as the only real difference is the duration of the Ready/–Busy signal and the internal workings of the devices (invisible to the controller). In a chip designed according to the present invention when no internal buffer is implemented, since data is written or read directly into or out of the memory array in real time without a buffer, this ready/busy signal is unnecessary, but to better facilitate the drop-in replacement of a NAND part, the pin is implemented even though for this as well as many of the commands (such as "Page Read" and "Page Write", as described above) the signal has little or no delay associated with it. For example, when reading when no internal buffer is implemented, the busy state is asserted but then the ready state is asserted immediately thereafter as there is no delay associated with transferring data from the array to an internal data buffer. However, other commands, such as a "Block Erase" where the operation proceeds based on internal logic and timing, the ready/busy signal would enable a controller or other external systems to know when the erase operation had completed. Other commands when no internal buffer is implemented, such as a command to perform an operation on the data in the buffer, would not be implemented or could perform that operation on the data in the array itself. Some commands that are required by a controller for normal NAND operation (such that the controller can interact with the part as if the part is actually a NAND part) would be included for better compatibility and can include such commands as "Read Part ID" and "Read Status Register" (even though many bits in a status register read may be fixed to always read as a particular state). Furthermore, since the part designed according to the present invention is inherently a random access part, the NAND command set can be enhanced with extra (non-conflicting) commands (using command codes unused in the NAND command set) that take advantage of the random access capabilities. These commands include commands that operate (e.g., read, write and erase) on data in sizes other than pages or blocks (e.g., on bytes, words, sectors, or other non-page or larger sized segments). Furthermore, when no internal buffer is implemented, the area on the chip associated with the data buffer is eliminated thereby reducing the cost of the chip.

Because it is desirable to be able to use standard controller chips for application with new memory technologies, the embodiment here is to implement a chip (e.g., utilizing phase change or MRAM technology) with adequate functionality similar to a NAND chip so that a standard controller may be used. This method involves accepting addresses, data, and commands provided to NAND chip but on a memory with the memory cell technology implemented in phase change memory (PCM). Even though PCM need not be erased in blocks, the embodiment here accepts commands to erase a block and implements an on-chip sequence of random access commands that automatically sequences through a block and programs each bit into the same state (such as a low resistance "set" state) for that group of bits or block (e.g., for a 128K block along with checksum and ECC bits). Alternately, the choice may be to write each bit into the "reset" or high resistance state. Then, upon receiving a programming command, the opposite state can be written into each bit to be programmed. Such erasing and programming may be done directly in PCM, or the bits within a byte may be first read and then only those bits needing to be reversed can be written. Such read before write (and write only if needed) may be applied to either erase or program to the opposite state, or both.

Minor changes to the controller, particularly those that can be implemented in the controller with only firmware changes, are anticipated as variations on the present invention; for example, the /CE input may be inverted to reduce power. In addition, commands such as "Page Write" (as a clocked sequence) or "Byte Write" may be implemented; a "Byte Write" may be implemented to support error correcting codes (ECC) whereby one or more bytes can be changed and then the ECC bytes could be updated and also written without having to rewrite an entire page or block. Also, additional commands that are not possible with NAND (such as "Byte Erase") may be implemented, thereby allowing use of a standard controller but also allowing special pass-through commands or management by a slightly modified controller; these commands can exist on a chip constructed according to the present invention without interfering with the paring of the chip and a standard controller (because such commands would never be invoked by a standard controller), but could be accessed by a standard controller in which firmware enhancements have been made.

Further, the cost of masks continues to increase, especially for critical layers. And the total cycle time to process a wafer is important, both for cost and cash flow to manufacture. To further reduce costs (both of masks and product wafers, as well as individual die cost), the above NAND-compatible chip (with or without additional commands not allowed by NAND) may be implemented with only NMOS transistors on the memory chip (and this design approach is elaborated upon in U.S. Pat. No. 7,813,157 by Shepard titled "NON-LINEAR CONDUCTOR MEMORY" which issued on Oct. 12, 2010, and U.S. patent application Ser. No. 12/417,245 by Shepard titled "LOW COMPONENT COMPLEXITY ELECTRONIC CIRCUITS AND METHODS FOR FORMING THE SAME" and filed on Apr. 2, 2009 and having a priority date of Apr. 10, 2008, and those applications are incorporated herein by reference in their entirety). Such a NAND-compatible design can involve providing an on-chip voltage to voltage converter (or "pump") to pump the typical low voltage supply to about 6V or greater if necessary during the programming. The present invention can be implemented in CMOS, in NMOS, in PMOS, or in NMOS along with PNP transistors, or in PMOS along with NPN transistors (and these latter two variations are elaborated upon in allowed U.S. patent application Ser. No. 12/827,545 by Shepard titled "BIPOLAR-MOS DRIVER CIRCUIT" that was filed on Jun. 30, 2010 and having a priority date of Jul. 7, 2009, and that application is incorporated herein by reference in its entirety).

To further improve costs, the fuse repair may be deleted and techniques applied to allow both shorts and opens of row, columns and rows to columns—also implemented on a NAND compatible PCM based chip implemented in NMOS—including a chip that accepts adequate NAND commands to allow full memory management and error correction, as is applied on a NAND chip. To further support error correcting, accesses to the memory arrays can be made along a diagonal path such that the failure of any one row or column will not cause the error correcting algorithm to fail as is described in U.S. Pat. No. 7,149,934 by Shepard titled "ERROR CORRECTING MEMORY ACCESS MEANS AND METHOD" which issued on Dec. 12, 2006.

Many storage element implementations are possible and some of these are described in U.S. patent application Ser. No. 12/720,843 by Shepard titled "$4F^2$ MEMORY CELLS COMPRISING THREE OR FOUR TERMINAL ACTIVE DEVICES" that was filed on Mar. 10, 2010. It should be noted that the present invention could be extended with the 3-D layering of storage elements as described in U.S. patent application Ser. No. 12/720,843 resulting in a 3-D cross-point array based memory device having a NAND compatible interface.

Embodiments of the present invention may include conductive strapping features that help to compensate for the series resistance of bit lines and/or word lines in order to provide greater current at a given memory cell while requiring lower supply voltages. To add strapping to reduce the resistance of the word lines, word line contacts can be intermittently placed along the length of the word lines (e.g., every 16 or 32 or 64 memory cells, or the like) and then connected to a metal word line conductor running above and parallel to each word line. In this way, the resistivity of the doped silicon word line is offset by a parallel, more conductive metal word line and only a short resistive segment (from the closest strapping connection between the doped word line and the parallel metal word line to the targeted memory cell) will occur within the path. Similarly, strapping could be added to the gate lines. Of course, the strapping must not interfere with the positioning of the storage elements and the bit lines. Since the bit lines run parallel with the gate lines, the gate line strapping can be placed below the bit lines (utilizing the spacer technique disclosed in U.S. patent application Ser. No. 61/275,169), however, the word line strapping would have to be located above the memory elements and the bit lines (to avoid colliding with the storage elements that connect between the bit lines and the tops of the transistors). The spacing of the word line strapping contact points can optionally be sized larger than the critical geometry along the direction of the word line for a minimal loss of array density. The gate line strapping could optionally be formed directly on the gate line poly thereby eliminating the need for the drop down connections, or the gate line material could be made of a higher conductive material such as metal and/or be made taller.

Many alternate embodiments of the present invention will come to mind to those skilled in the art. PMOS transistors could be created for a reversed polarity array by altering the dopant profiles. The manufacturing techniques described herein could also be used to form bipolar transistors, four-layer diodes (i.e., thrystors or the like) or other switching devices (e.g., SCR's, diacs or the like). The transistor could be utilized such that the drain is common to the transistors connected by a single word line (as described above, the source is common to the transistors connected by a single word line).

Embodiments of the present invention will typically, though not necessarily, be built as integrated circuits by means of photolithography. Embodiments may be implemented with a traditional two dimensional arrangement of storage elements or with a three-dimensional arrangement of storage elements. The storage elements may include a fuseable material, an antifuseable material, a phase-change material (for PRAM) such as a chalcogenide alloy material (including a chalcogenide in which the programmed resistivity may be one of two resistance values and, in the case of more than one bit per cell storage cells, in which the programmed resistivity may be one of three or more resistance values), a resistive change material (for RRAM), a ferroelectric material (for FRAM), a magnetic or magnetoresistive material (for MRAM), magnetic tunnel junction or spin-transfer torque element (for MTJ-RAM or STT-RAM), a dual layer oxide memory element comprising a junction and an insulating metal oxide and a conductive metal oxide (see U.S. Pat. No. 6,753,561 by Rinerson), or a trapped charge device (see U.S. Pat. No. 7,362,609 by Harrison, et al). The phase-change material, such as a Chalcogenide material, may be programmed or erased. Orientation of the array may be rotated, i.e., the "rows" may be "columns," or vice versa. The polarity of the voltages and direction of the steering elements in the storage bits may be reversed while still keeping within what is envisioned by embodiments of the present invention. The present invention may be applied to other memory technologies as well including static RAM, FLASH memory, EEPROM, DRAM, and others not mentioned, including memory technologies yet to be commercialized or invented.

Memory devices incorporating embodiments of the present invention may be applied to memory devices and systems for storing digital text, digital books, digital music (such as MP3 players and cellular telephones), digital audio, digital photographs (wherein one or more digital still images may be stored including sequences of digital images), digital video (such as personal entertainment devices), digital cartography (wherein one or more digital maps can be stored, such as GPS devices), and any other digital or digitized information as well as any combinations thereof. Devices incorporating embodiments of the present invention may be embedded or removable, and may be interchangeable among other devices that can access the data therein. Embodiments of the invention may be packaged in any variety of industry-standard form factor, including Compact Flash, Secure Digital, MultiMedia Cards, PCMCIA Cards, Memory Stick, any of a large variety of integrated circuit packages including Ball Grid Arrays, Dual In-Line Packages (DIPs), SOICs, PLCC, TQFPs and the like, as well as in proprietary form factors and custom designed packages. These packages may contain just the memory chip, multiple memory chips, one or more memory chips along with other logic devices or other storage devices such as PLDs, PLAs, micro-controllers, microprocessors, controller chips or chip-sets or other custom or standard circuitry.

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:

1. An integrated circuit memory device (i) for replacing a NAND memory device comprising a plurality of series-connected memory cells, and (ii) responsive to a NAND-memory controller configured to issue (a) a page program command for transferring a page comprising a plurality of bytes of data into a data buffer of the NAND memory device and, thereafter, transferring the bytes of data from the data buffer simultaneously into memory cells of the NAND memory device in parallelized fashion, and (b) a page read command for transferring a page comprising a plurality of bytes of data simultaneously from memory cells of the NAND memory device into the data buffer of the NAND memory device in parallelized fashion and, thereafter, reading the page of data out of the data buffer, the integrated circuit memory device comprising:

a plurality of memory cells configured in an internal random access architecture; and a command-based interface comprising circuitry configured to:

(i) receive the page program command and a page comprising a plurality of bytes of data and, thereafter, write unbuffered bytes of data of the page directly into the memory cells in bit-wise, random-access fashion, and (ii) receive the page read command and, thereafter, read a page comprising a plurality of bytes of unbuffered data directly from the memory cells in bit-wise, random-access fashion.

2. The integrated circuit memory device of claim 1, wherein at least one of the plurality of memory cells comprises at least one of a fuseable material, an antifuseable material, a phase-change material, a Chalcogenide material, a resistive change material, a ferroelectric material, a magnetic material, a magneto-resistive material, a magnetic tunnel junction, a spin-transfer torque element, a dual layer oxide, an insulating metal oxide, a conductive metal oxide, or a trapped charge device.

3. The integrated circuit memory device of claim 1, wherein the integrated circuit memory device is contained in a package that is removable and interchangeable among two or more devices.

4. The integrated circuit memory device of claim 1, wherein the integrated circuit memory device stores information comprising at least one of text, books, music, audio, photographs, still images, sequences of images, video, or cartography.

5. The integrated circuit memory device of claim 1, wherein the command-based interface comprises a chip enable input that is inverted from a chip enable input of the NAND memory device.

6. The integrated circuit memory device of claim 1 comprising NMOS transistors and not PMOS transistors.

7. The integrated circuit memory device of claim 6 further comprising PNP transistors.

8. The integrated circuit memory device of claim 1 comprising PMOS transistors and not NMOS transistors.

9. The integrated circuit memory device of claim 8 further comprising NPN transistors.

10. The integrated circuit memory device of claim 1, wherein (i) the NAND-memory controller is configured to issue error-correction commands and (ii) the command-based interface comprises circuitry configured to receive the error-correction commands and correct errors within the plurality of memory cells.

11. The integrated circuit memory device of claim 10, wherein the circuitry configured to correct errors is configured for sequential access to the plurality of memory cells along a diagonal path therethrough.

* * * * *